(12) United States Patent
Erokhin et al.

(10) Patent No.: US 7,939,424 B2
(45) Date of Patent: May 10, 2011

(54) WAFER BONDING ACTIVATED BY ION IMPLANTATION

(75) Inventors: Yuri Erokhin, Georgetown, MA (US); Paul Sullivan, Wenham, MA (US); Steven R. Walther, Andover, MA (US); Peter Nunan, Monte Serano, CA (US)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 323 days.

(21) Appl. No.: 12/212,386

(22) Filed: Sep. 17, 2008
(Under 37 CFR 1.47)

(65) Prior Publication Data
US 2009/0081848 A1  Mar. 26, 2009

Related U.S. Application Data

(60) Provisional application No. 60/974,250, filed on Sep. 21, 2007.

(51) Int. Cl.
*H01L 21/30* (2006.01)
*H01L 21/46* (2006.01)

(52) U.S. Cl. ........... 438/458; 250/492.21; 257/E21.002; 257/E21.001; 438/799

(58) Field of Classification Search ............... 438/799, 438/458; 257/E21.002, E21.001, E21.147, 257/E21.088; 250/492.21
See application file for complete search history.

(56) References Cited

U.S. PATENT DOCUMENTS

| | | | |
|---|---|---|---|
| 6,180,496 B1 | 1/2001 | Farrens et al. | |
| 6,645,828 B1 * | 11/2003 | Farrens et al. | 438/455 |
| 6,908,832 B2 | 6/2005 | Farrens et al. | |
| 2002/0000779 A1 * | 1/2002 | Anders | 315/111.21 |
| 2002/0157790 A1 | 10/2002 | Abe et al. | |
| 2002/0182827 A1 | 12/2002 | Abe et al. | |
| 2003/0111617 A1 * | 6/2003 | Pharand et al. | 250/492.21 |
| 2006/0264013 A1 * | 11/2006 | Rouh et al. | 438/514 |
| 2007/0296035 A1 | 12/2007 | George et al. | |
| 2008/0073577 A1 * | 3/2008 | Relleen et al. | 250/492.21 |
| 2008/0311686 A1 * | 12/2008 | Morral et al. | 438/7 |

FOREIGN PATENT DOCUMENTS

| | | | |
|---|---|---|---|
| JP | 200036583 A | | 2/2000 |
| KR | 20020019660 A | | 3/2002 |
| WO | WO 2007/019277 A | * | 2/2007 |

* cited by examiner

*Primary Examiner* — Caridad M Everhart (57) ABSTRACT

A method for wafer bonding two substrates activated by ion implantation is disclosed. An in situ ion bonding chamber allows ion activation and bonding to occur within an existing process tool utilized in a manufacturing process line. Ion activation of at least one of the substrates is performed at low implant energies to ensure that the wafer material below the thin surface layers remains unaffected by the ion activation.

14 Claims, 5 Drawing Sheets

WAFER BONDING ACTIVATED BY ION IMPLANTATION

STATEMENT REGARDING RELATED APPLICATIONS

This application claims the benefit of priority to U.S. Provisional Application No. 60/974,250 entitled "Wafer Bonding Activated By Ion Implantation," filed Sep. 21, 2007.

BACKGROUND OF THE INVENTION

1. Field of the Invention

Embodiments of the invention relate to the field of substrate implantation and bonding. More particularly, the present invention relates to an apparatus and method for ion activation of substrates to facilitate bonding.

2. Discussion of Related Art

Ion implantation is a process used to dope ions into a work piece. One type of ion implantation is used to implant impurity ions during the manufacture of semiconductor substrates to obtain desired electrical device characteristics. As is well known in the art, silicon wafers have a crystalline structure wherein the intrinsic conductivity of the silicon is too low to be a useful electrical device. However, by doping a desired impurity into the crystal lattice a current carrier is formed. The material to be doped into the wafer is first ionized in an ion source. The ions are extracted from the ion source and accelerated to form an ion beam of prescribed energy which is directed at the surface of the wafer. The energetic ions in the beam penetrate into the bulk of the wafer and embed into the crystalline lattice of the semiconductor material to form a region of desired conductivity.

An ion implanter generally includes an ion source chamber which generates ions of a particular species, a series of beam line components to control the ion beam and a platen or chuck to support the wafer that receives the ion beam. These components are housed in a vacuum environment to prevent contamination and dispersion of the ion beam. The beam line components may include a series of electrodes to extract the ions from the source chamber, a mass analyzer configured with a particular magnetic field such that only the ions with a desired mass-to-charge ratio are able to travel through the analyzer, and a corrector magnet to provide a ribbon beam which is directed to a wafer orthogonally with respect to the ion beam to implant the ions into the wafer substrate. The ions lose energy when they collide with electrons and nuclei in the substrate and come to rest at a desired depth within the substrate based on the acceleration energy. The depth of implantation into the substrate is based on the ion implant energy and the mass of the ions generated in the source chamber. The ion beam may be distributed over the substrate by electrostatic or magnetic beam scanning, by substrate movement, or by a combination of beam scanning and substrate movement. The ion beam may be a spot beam or a ribbon beam having a long dimension and a short dimension. Typically, arsenic or phosphorus may be doped to form n-type regions in the wafer and boron, gallium or indium are doped to create p-type regions in the wafer.

Alternatively, a plasma doping process may also be used to dope a semiconductor wafer. A wafer to be doped is placed on an electrically-biased platen, which functions as a cathode and is located in a plasma doping module. An ionizable doping gas is introduced into the chamber and a voltage pulse is applied between the platen and an anode or the chamber walls causing formation of a plasma containing ions of the dopant gas. The plasma has a plasma sheath in the vicinity of the wafer. The applied pulse causes ions in the plasma to be accelerated across the plasma sheath and implanted into the wafer. The depth of implantation is related to the voltage applied between the wafer and the anode or the chamber walls. In this manner, very low implant energies can be achieved. Plasma doping systems are described, for example, in U.S. Pat. No. 5,354,381 issued Oct. 11, 1994 to Sheng; U.S. Pat. No. 6,020,592 issued Feb. 1, 2000 to Liebert, et al.; and U.S. Pat. No. 6,182,604 issued Feb. 6, 2001 to Goeckner, et al. In other types of plasma doping systems, a continuous plasma is produced, for example, by inductively-coupled RF power from an antenna located internal or external to the plasma doping chamber. The antenna is connected to an RF power supply. Voltage pulses are applied between the platen and the anode at particular intervals causing ions in the plasma to be accelerated toward the wafer.

Many semiconductor processes involve wafer bonding where different materials are unified to create new electronic devices that can not otherwise be fabricated using a single silicon wafer. Some common processes that rely on wafer bonding include, for example, silicon-on-insulator (SOI) fabrication and three-dimensional stacked chip fabrication. There are several different methods of manufacturing an SOI chip. One method forms an SOI structure in a layer transfer process in which a crystalline silicon wafer is bonded to the top of a silicon dioxide layer previously formed on another crystalline silicon wafer. Van der Waals forces cause the two wafers to adhere immediately, allowing a stronger bond to be formed by heating the wafers in an annealing step. The active semiconductor layer is then cleaved along a plane and the upper portion is removed to provide a suitably thin active semiconductor layer. Integrated circuits are then fabricated on this isolated silicone layer. SOI technology is used to reduce junction capacitance and parasitic leakage current to improve semiconductor device speeds.

In order to prepare the wafers to be bonded, the surfaces must be activated. One method of activation relies on treating the wafers with wet chemistries to create bonding forces and applying a subsequent annealing process at high temperatures (>900° C.) to strengthen the bond. Plasma activation is another process used to activate wafer surfaces for bonding. In this method, wafers are placed in a plasma chamber where they are exposed to plasmas (e.g. H2, O2, etc.) and, without breaking vacuum, the wafer surfaces are placed together and bonding occurs. By using plasma activation, the mobility of the ionic species on the surfaces of the wafer increases which increases the oxide reaction thereby enhancing the bonding process. In addition, plasma activation reduces the possibility for contamination as well as obviating the need for temperature annealing. However, plasma activation requires bonding of the substrate surfaces within a dedicated process device, such as, for example, a plasma chamber within a semiconductor cluster tool. A typical semiconductor cluster tool is comprised of several different wafer processing modules that may be managed by a centralized control system. Use of a separate process tool increases complexity and cost of wafer fabrication within a cluster tool as well as during the manufacturing process. Accordingly, there is a need in the art for an improved apparatus and method for wafer bonding activation.

SUMMARY OF THE INVENTION

Exemplary embodiments of the present invention are directed to a wafer bonding method activated by ion implantation. In an exemplary embodiment, the method includes placing at least two substrates into an ion target chamber. At least one surface of a first of the two substrates is exposed to an ion beam. This exposure reduces the surface species of the substrate in preparation for bonding to a second substrate. The first and second substrates are aligned at a desired temperature within the chamber. The exposed surface of the first substrate is positioned together and in contact with a surface of the second substrate to form bonded substrates.

DESCRIPTION OF EMBODIMENTS

The present invention will now be described more fully hereinafter with reference to the accompanying drawings, in which preferred embodiments of the invention are shown. This invention, however, may be embodied in many different forms and should not be construed as limited to the embodiments set forth herein. Rather, these embodiments are provided so that this disclosure will be thorough and complete, and will fully convey the scope of the invention to those skilled in the art. In the drawings, like numbers refer to like elements throughout.

Figure 1:
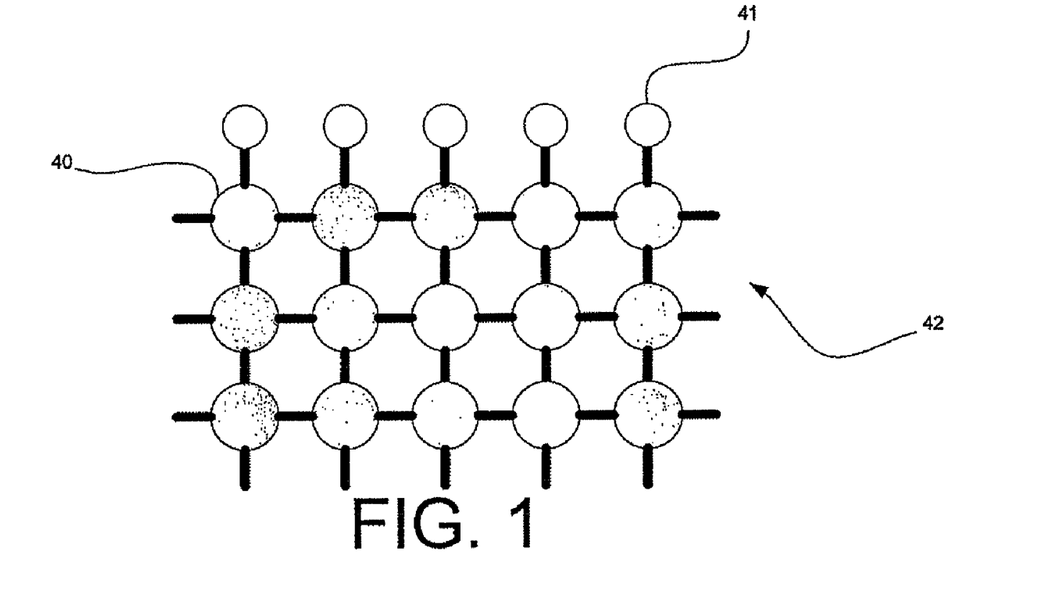
FIG. 1 is a schematic of an exemplary substrate surface prior to activation.

The apparatus and methods are described herein in connection with an ion implanter. However, the methods can be used with other systems and processes involved in semiconductor manufacturing or other systems that use bonding of substrates. Thus, the invention is not limited to the specific embodiments described below. As described above, activation of substrate bonding surfaces improves the quality of SOI wafers or other products where bonding of two substrates is required. FIG. 1 is a view of an exemplary substrate surface prior to activation. Substrate 42 may be a wafer or other work-piece composed of a lattice structure having a plurality of atoms 40. Atoms 40 may be silicon or other elements where, for example, the outer shells of these atoms share electrons with neighboring atoms to form covalent bonds resulting in a stable lattice structure. However, the atoms 40 located at the surface of substrate 42 are not bonded with adjacent atoms (e.g. in the lateral direction) to form covalent bonds. These atoms at the surface are considered unsaturated because they lack a neighboring atom to form a covalent bond. Some electrons at the outer shells in atoms 40 in the first monolayer are saturated through interaction with adjacent atoms 40. However, these bonds are relatively weak. Other electrons from atoms 40 are saturated through interaction with impurities passivating the surface of the substrate or with other compounds neighboring these atoms. In this manner, atoms 40 will bond with compound 41 which may be, for example, an adsorbed material on the surface of substrate 42, such as an organic film. Though the bonds between atoms 40 and compound 41 are not as strong as bonds between atoms 40 in a bulk crystal lattice, these bonds still reduce reactivity of the atoms 40 at the surface of substrate 42. As mentioned above, one method for causing these atoms to be reactive is exposing the substrate surface to wet chemistries to create bonding forces and applying a subsequent annealing process at high temperatures for a specified period of time. This process renders the substrate surface hydrophilic and amenable to bonding. Another method used to activate the surface of substrate 42 includes exposing the surface to a plasma. This increases the mobility of the ionic species on the wafer's surface which increases the oxide reaction thereby enhancing the bonding process. However, each of these processes have their respective drawbacks as noted above.

Figure 2:
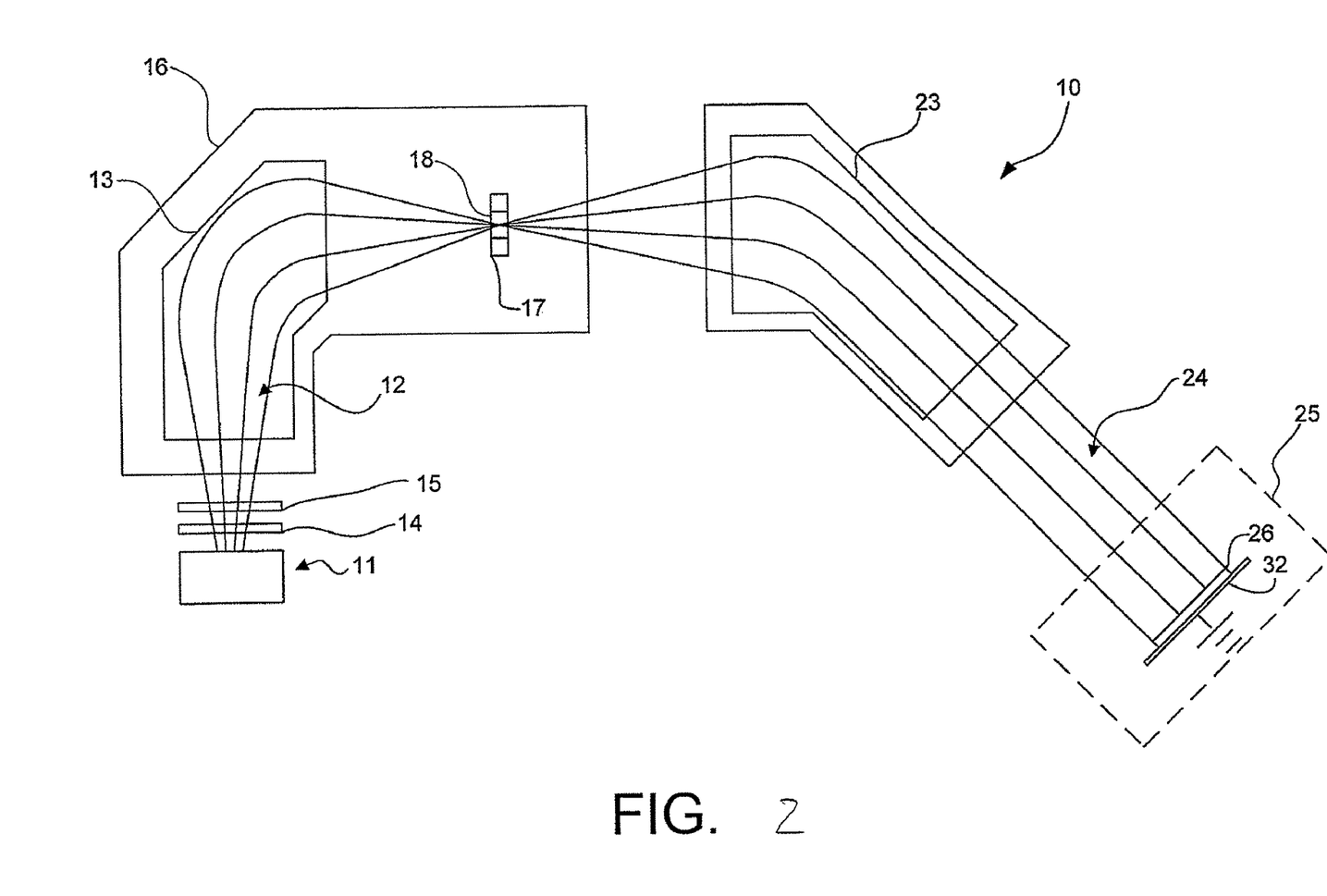
FIG. 2 is an exemplary ion implanter in accordance with an embodiment of the present invention.

FIG. 2 is an embodiment of an ion implanter 10 used to activate the surface of substrate 42 in accordance with the present invention. The ion implanter may already be incorporated into different parts of a semiconductor production process used, for example, with SOI or three-dimensional stacked chip wafer manufacturing. Ion implanter 10 includes ion beam source chamber 11 which may also have a gas box containing a desired gas to be ionized. Ion beam source chamber 11 may be an indirectly heated cathode (IHC), a microwave ion source, or an RF ion source. Once the gas is supplied to the ion source chamber, ions are extracted from the ion chamber to form ion beam 12. The ions are extracted using a standard three (3) electrode configuration comprising a plasma or arc slit electrode, suppression electrode 14 and ground electrode 15 downstream from suppression electrode 14. These electrodes are used to create a desired electric field to focus ion beam 12 extracted from source chamber 11. The strength of the electric field generated by the electrodes can be tuned to a desired beam current to extract a particular type of ion beam 12. Ion beam 12 travels to mass analyzer 16 which includes resolving magnet 13 and masking electrode 17 having resolving aperture 18. Resolving magnet 13 deflects ions in ion beam 12 such that ions of a desired ion species pass through resolving aperture 18. Undesired ion species do not pass through resolving aperture 18, but are blocked by masking electrode 17. In one embodiment, resolving magnet 13 deflects ions of the desired species by approximately 90°.

Ions of the desired species pass through resolving aperture 18 to angle corrector magnet 23. In some embodiments, ions of the desired species also pass through a deceleration stage (not shown). Angle corrector magnet 23 deflects ions of the desired ion species and converts the ion beam from a diverging ion beam to ribbon beam 24 which has substantially parallel ion trajectories. In one embodiment, angle corrector magnet 23 deflects ions of the desired ion species by approximately 70°. Ion beam 12 may in some embodiments pass through an acceleration column. This acceleration column selectably controls the energy of ion beam 12 and assists in causing desired concentration and penetration of ion beam 12 into substrate or wafer 26. Ribbon beam 24 may also pass through an acceleration column which may be disposed between mass analyzer 16 and corrector magnet 23 or may be located after corrector magnet 23. End station 25 includes chuck 32 used to support a wafer or other work-piece 26 targeted for in situ ion implantation and is aligned with the path of ribbon beam 24 such that ions of the desired species are implanted into wafer 26. End station 25 may also include a scanner for moving wafer 26 perpendicular to the long dimension of the ribbon beam 24 cross-section or performing other one-dimensional scans, thereby distributing ions over the entire surface of wafer 26. Chuck 32 may also be configured to rotate and provide orthogonal scan correction.

Ion implanter 10 activates the bonding surfaces of the substrates through implantation of, for example, silicon, oxygen, germanium, xenon, helium, neon, argon, krypton, carbon dioxide, nitrogen, other chemically-active or inert species, other monomer ions, other ionized molecules, or clusters of atoms. These implants may be at energies low enough (0.2 to 5 keV depending on the specie) and doses high enough (3E15 to 1E17) to activate a thin surface layer of each wafer. Use of low implant energies for surface activation ensures that the wafer material below the thin surface layer remains unaffected by ion implantation. Depth of the surface layer affected by this ion implant surface activation may be further controlled by tilting the wafer with respect to the ion beam. Tilting the wafer affects channeling, which prevents implanted ions from being implanted too deep into the wafer. Tilting the wafer also increases the number of interactions per unit depth into the surface of the wafer. Tilting the wafer also causes more collisions in the desired region near the surface of the wafer. In this manner, tilting the wafer during ion implantation controls the operation in a preferred energy range for beam implantation. Surface activation of wafer 26 may also be improved by ion implantation at temperatures other than room temperature. For example, heating wafer 26 at temperatures ranging from −50° C. to 200° C., volatizes the surface species, such as compound 41 in FIG. 1.

Figure 3:
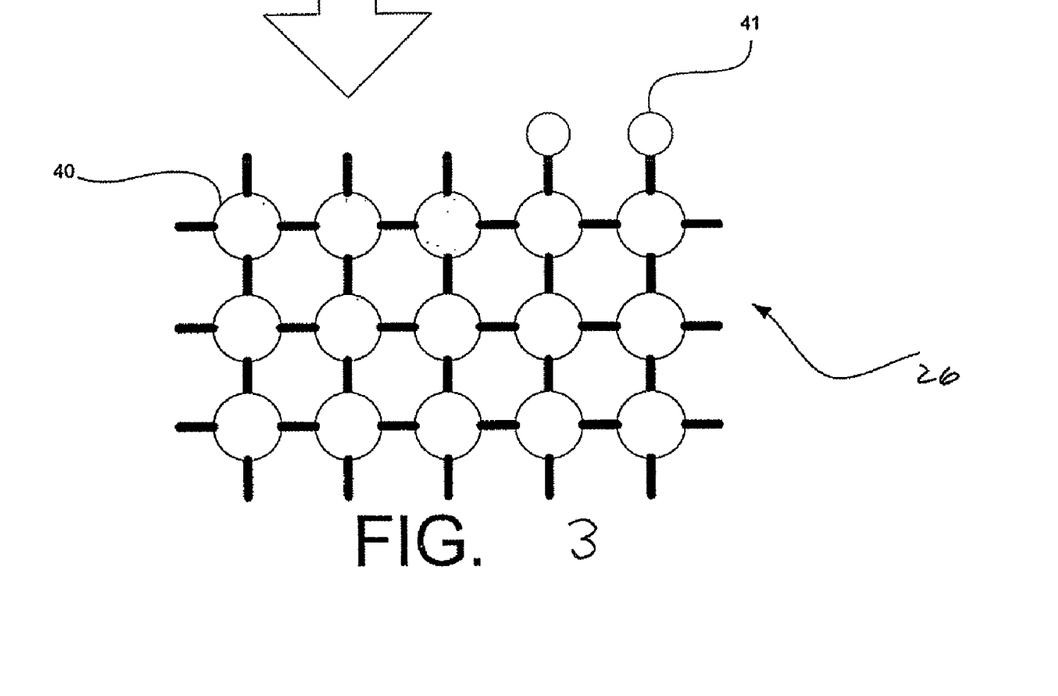
FIG. 3 is a schematic of the substrate shown in FIG. 1 after the surface has been activated using the ion implanter of FIG. 2 in accordance with an embodiment of the present invention.

FIG. 3 schematically illustrates the lattice structure of FIG. 1 after activation using ion implanter 10 in accordance with the present invention. Ion beam 24 implants or targets the surface of substrate 26. This will remove compound 41 from the surface of the substrate which leaves atoms 40 available for bonding to another material or substrate. The surface of substrate 26 is "active" which enhances the bonding process. This activation process creates dangling bonds ready to bond to another substrate. A dangling bond is essentially a broken covalent bond and in this case, the dangling bond is found on the surface of the silicon wafer with two dangling bonds per surface lattice atom 40. Although FIG. 3 illustrates activation of one surface of substrate 26, ion implantation may be performed on the surfaces of each substrate configured for bonding. Ion beam 24 used to activate the surface of substrate 26 may be a ribbon beam, but may also be a spot or other ion beam configuration. In addition, ions generated from plasma in a plasma doping tool may be also be used to activate the substrate for bonding.

Surface activation may be chained with an implant step used to define a post-bond splitting process. This post-bond splitting process may be used in, for example, SOI fabrication. In particular, an oxide film is formed on the wafer and hydrogen and/or helium are implanted into the upper surface of one of the wafers to be bonded in order to form a fine bubble layer within the wafer. The ion-implanted silicon wafer is superposed on another silicon wafer such that the ion-implanted surface comes into close contact with the other silicon wafer via the oxide film. The wafer is heat treated to delaminate a portion of one of the wafers using the fine bubble layer as a delaminating plane to form a thin film silicon layer. Alternatively, ion surface activation may be applied prior to the hydrogen and/or helium implant which forms the bubble layer. Surface activation may be performed on surfaces with or without an oxide layer formed on them depending on the embodiment. Alternatively, the split wafer can be reused to form other SOI wafers. In other embodiments, bonding is performed after the anneal or other thermal step. In this manner, the ion implanter can provide benefits of improved bonding strength and wafer bonding at reduced temperatures while arranging surface activation as a chained implant with hydrogen or another specie-splitting implant. Moreover, the specie-splitting implant and surface activating implant are performed in the same ion implanter. Post-bond splitting may be used in, for example, three-dimensional stacked chips, integrated circuits, or other multi-layer chip technology. Post-bond splitting may be used in any layer transfer based process, such as the fabrication of thin films. The thin film fabrication may be performed on an expensive material, such as GaN which is then attached to an inexpensive handle wafer. Post-bond splitting may also be used to engineer novel semiconductor substrates such as, for example, GaAs on Si or Ge on Si.

FIGS. 4-7 depict exemplary process chambers and two wafers configured for bonding to form an SOI wafer utilizing ion activation via implanter 10. The process chambers illustrated in FIGS. 4-7 may replace or be an addition to end station 25 utilizing ion beam 24. By utilizing ion activation, the process chamber of ion implanter 10 provides improved capability to bond the two substrate surfaces that have been activated within the vacuum. This step eliminates the need to expose the substrates to atmosphere and/or transporting the wafers to another process tool to conduct the bonding step. In this manner, by using an ion implanter for pre-bonding surface activation, it eliminates the need for an extra process tool typically dedicated to either plasma activation and/or wet chemistry exposure, thereby streamlining the production process and reducing associated manufacturing costs.

Figure 4:
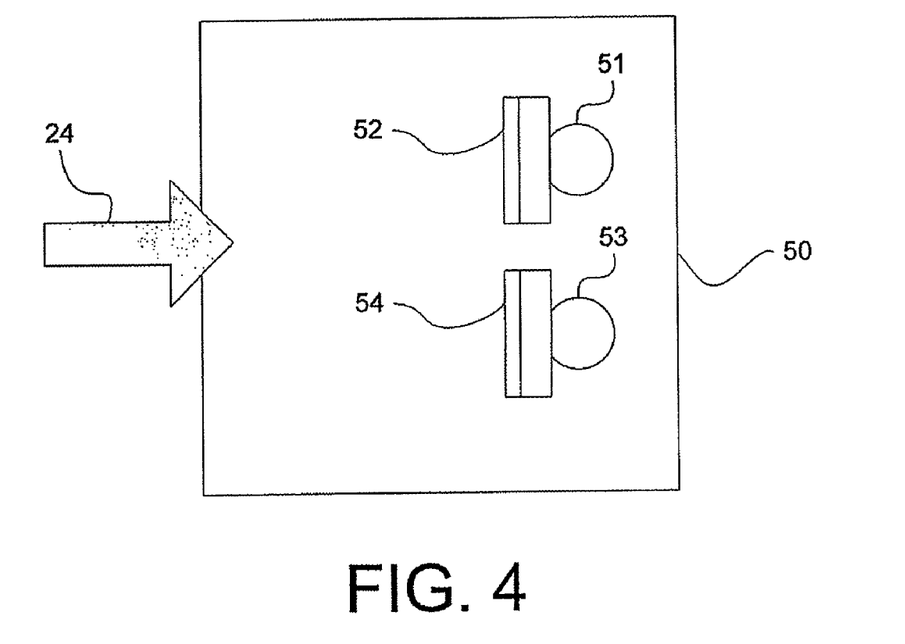
FIG. 4 illustrates a process chamber of the ion implanter in accordance with an embodiment of the present invention.

FIG. 4 is a view of a first embodiment of a process chamber 50 in accordance with the present invention which includes one or more openings configured to receive beam 24. Process chamber 50 includes chuck 51 configured to hold substrate 52 and chuck 53 is configured to hold substrate 54. Substrate 52 may be, for example, a support work-piece used in SOI fabrication and substrate 54 may be configured for cleaving or undergo a post-bond split process as described above. Thus, the implant to perform the cleaving or post-bond split, such as hydrogen or helium, has already been performed in this embodiment. Chuck 51 and chuck 53 are movably configured within process chamber 50. In particular, at least one or both of chucks 51 and 53 may be displaced in the path of beam 24. At least one of the substrates 52 and 54 is activated by ion implantation, aligned and brought into contact with each other at a desired temperature. Process chamber 50 is also configured to control the temperature of substrate 52 and substrate 54 up to 500° C. Alternatively, chucks 51 and 53, rather than chamber 50, are configured for temperature control up to 500° C.

Figure 5:
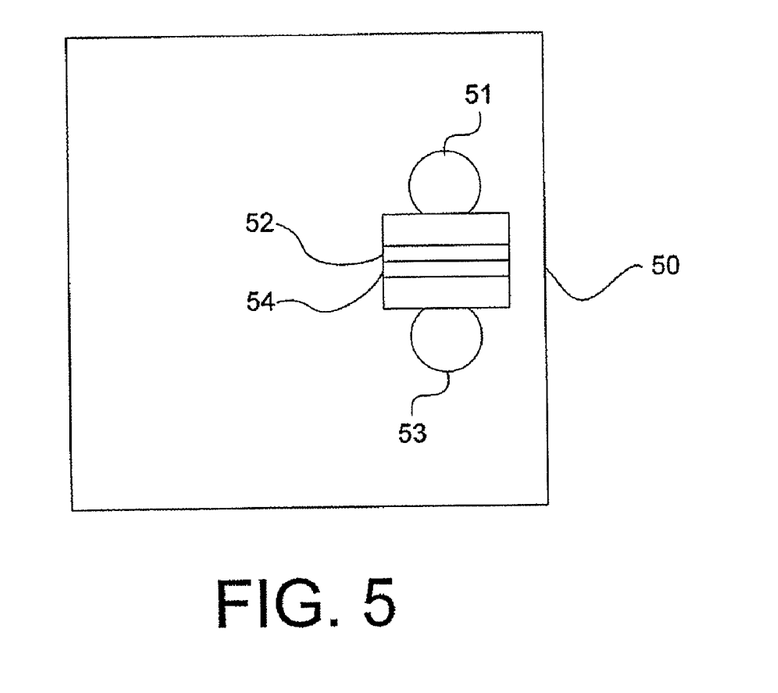
FIG. 5 is an alternative view of the process chamber shown in FIG. 4 of the ion implanter in accordance with an embodiment of the present invention.

FIG. 5 is an alternative view of the process chamber 50 shown in FIG. 4 in which substrates 52 and 54 are shown in contact with one another at a desired temperature for a defined period of time. Chuck 53 releases substrate 54 and the combined substrate 52 and substrate 54 are removed from the process chamber 50 as a single unit. Alternatively, after substrate 52 and substrate 54 remain in contact with one another at a desired temperature for a defined period of time, the temperature can be raised to initiate splitting. Chuck 51 retains the support wafer with the newly cleaved layer on top and chuck 53 retains the remaining post-split layer. In another embodiment, only one of chucks 51 or 53 is included in process chamber 50 and a wafer handling robot holds the second substrate used for bonding to the other substrate. Alternatively, process chamber 50 may include one or more chucks and a plurality of wafer handling robots to manipulate and facilitate bonding between the two substrates 52 and 54.

Figure 6:
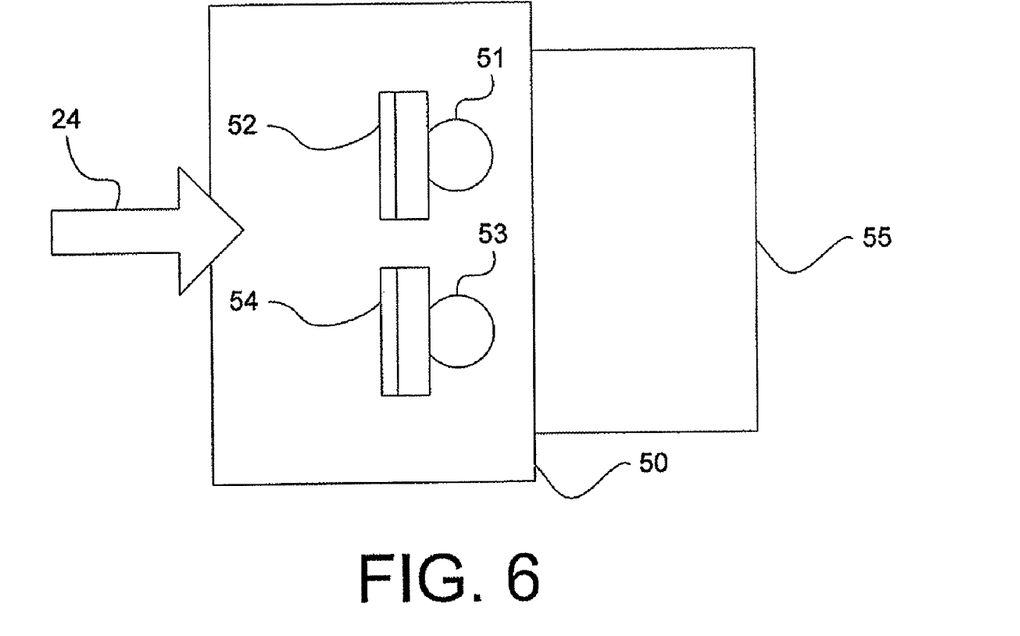
FIG. 6 illustrates an alternative embodiment of a process chamber of the ion implanter in accordance with an embodiment of the present invention.
Figure 7:
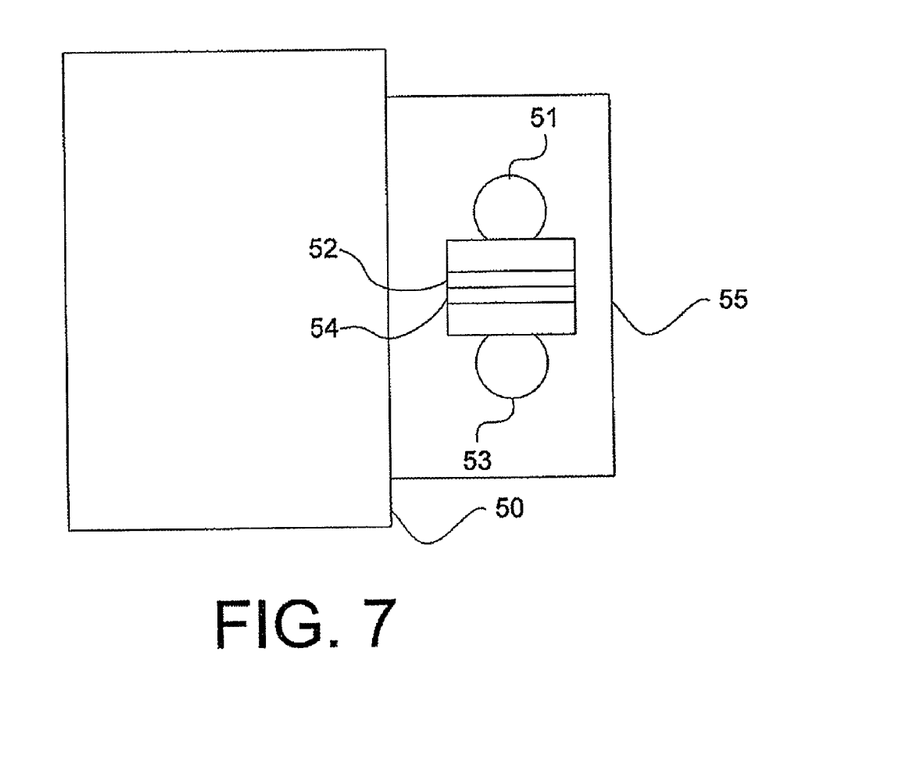
FIG. 7 is an alternative view of the process chamber shown in FIG. 6 of the ion implanter in accordance with an embodiment of the present invention another.

FIG. 6-7 illustrate an alternative embodiment in which a separate chamber 55 is employed for substrate bonding and chamber 50 is used for ion implantation by beam 24. of the process chamber 50. Bonding chamber 55 is connected via a vacuum link to process chamber 50. As illustrated in FIG. 7, chuck 51 and chuck 53 are configured to move between the process chamber 50 and bonding chamber 55. In particular, one or more ion implantation steps is performed on substrates 52 and 53 in process chamber 50 and chucks 51 and 53 transfer substrates 52 and 54, respectively to separate chamber 55 while maintaining the vacuum environment. Substrate 52 and substrate 54 would then remain in contact with one another within bonding chamber 55 at a desired temperature for a defined period of time. Chuck 53 releases substrate 54 and the combined substrate 52 and substrate 54 supported by chuck 51 is removed from bonding chamber 55 as a single unit. If the process steps require splitting of the combined substrate, the temperature in chamber 55 can be raised to initiate this splitting process. Chuck 53 is then moved away from the proximity of chuck 51 and chuck 51 supports the wafer with the newly cleaved layer on top while chuck 53 would have the remaining post-split layer. Process chamber 55 is also configured to control the temperature of substrate 52 and substrate 54 up to 500° C. Alternatively, chucks 51 and 53, rather than chamber 55, are configured for temperature control up to 500° C. In another embodiment, surface activation may also allow bonding to be performed in another chamber outside the process chamber 50. In another embodiment, only one chuck is included in process chamber 50. A wafer handling robot is used to hold the second substrate used for bonding. Bonding chamber 55 may also include two wafer handling robots configured to transfer substrates 52 and 54 from process chamber 50 to bonding chamber 55. Alternatively, process chamber 50 may include one or more chucks and at least one wafer handling robot to transfer substrates 52 and 54 from process chamber 50 to bonding chamber 55.

Figure 8:
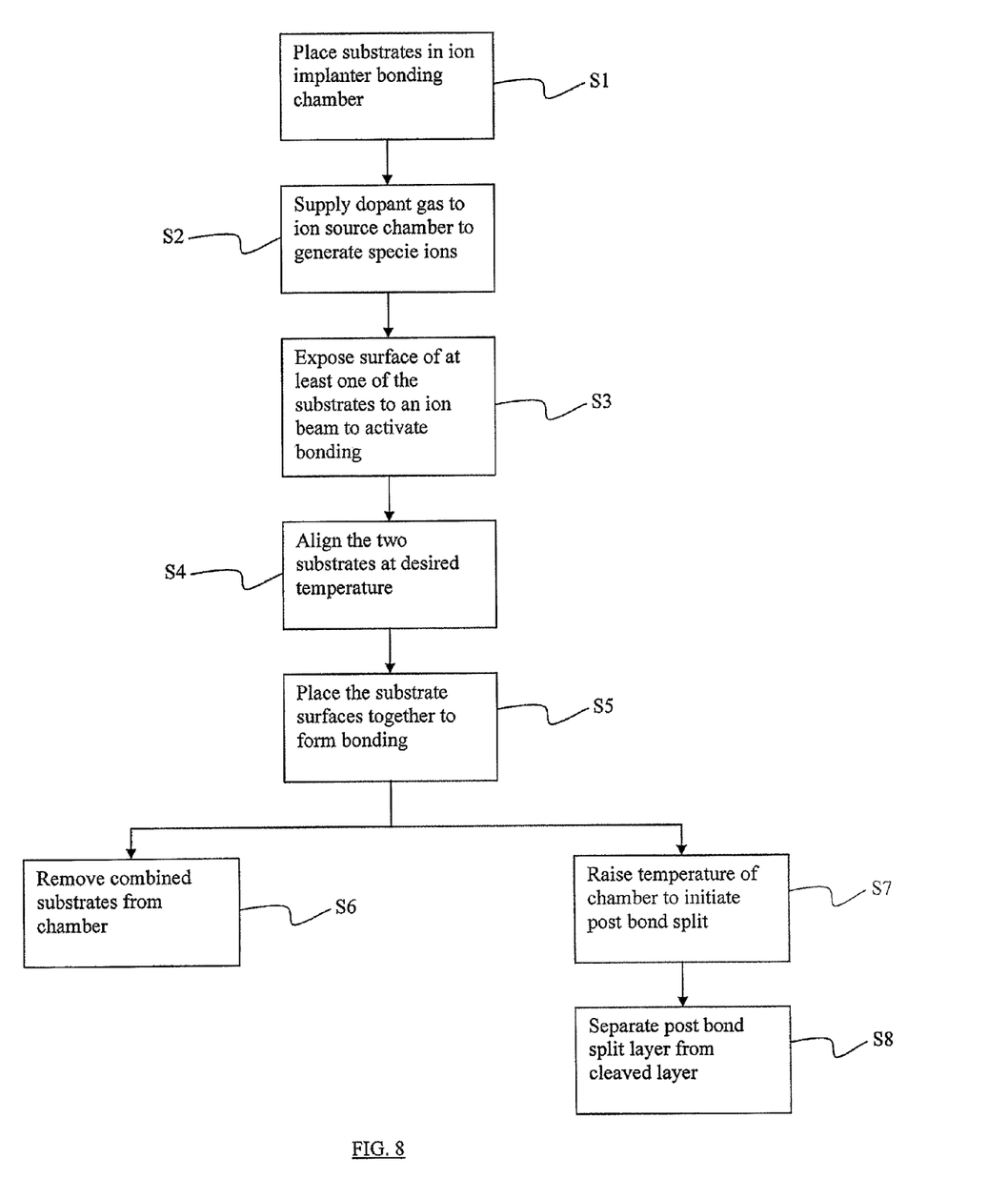
FIG. 8 is a flow chart illustrating the process of activation associated with the ion implanter shown in FIG. 2 in accordance with an embodiment of the present invention

FIG. 8 is a flow chart illustrating the process of activation associated with the ion implanter shown in FIG. 2 in accordance with an embodiment of the present invention. Those skilled in the art will appreciate that the method can be modified to suit a variety of applications depending on the substrates to be bonded and the various process conditions. Substrates 52 and 54 are placed in the ion implanter bonding chamber 50 at step S1. A dopant gas is supplied to ion source chamber 11 to generate specie ions suitable for pre-bond substrate surface activation at step S2. The substrates 52 and/or 54 are positioned on chucks 51 and 53 respectively, and the surface of at least one of the substrates is exposed to the generated specie ions at step S3 in the form of an ion beam. At step S4, the two substrates 52 and 54 are aligned at the desired temperature and the substrates are bonded together at step S5. The combined substrates are removed from chamber 50 at step S6. Alternatively, the bonded substrates remain in chamber 50 and the temperature of the chamber is raised to initiate post bond splitting at step S7. The post bond split layer is then separated from the cleaved layer at step S8 and the substrates are removed from the chamber.

While the present invention has been disclosed with reference to certain embodiments, numerous modifications, alterations and changes to the described embodiments are possible without departing from the sphere and scope of the present invention, as defined in the appended claims. Accordingly, it is intended that the present invention not be limited to the described embodiments, but that it has the full scope defined by the language of the following claims, and equivalents thereof.

What is claimed is:

1. A method for in situ bonding at least two substrates together comprising:
    placing the substrates into an ion target chamber;
    exposing at least one surface of a first of said at least two substrates to an ion beam to reduce the surface species of the at least one surface in preparation for bonding to a second of said at least two substrates;
    aligning the first and second substrates at a desired temperature within said ion target chamber;
    placing the exposed surface of said first substrate together and in contact with a surface of said second substrate to form bonded substrates; and
    raising the temperature of said second chamber to initiate a post bond split layer of said bonded substrates.

2. The method of claim 1 further comprising removing the bonded substrates from said ion target chamber.

3. The method of claim 1 wherein said first substrate is a silicon wafer having a silicon dioxide layer.

4. The method of claim 1 further comprising exposing at least one surface of said second substrate to an ion beam to reduce the surface species of the at least one surface in preparation for bonding to said first substrate.

5. The method of claim 1 wherein said at least one surface of the first substrate is exposed to the ion beam having implant energies between 0.2 keV and 5 keV.

6. The method of claim 1 further comprising tilting the first substrate at an angle with respect to said ion beam when the first substrate is exposed to said ion beam.

7. The method of claim 1 further comprising creating a cleaved layer from said bonded substrates.

8. The method of claim 7 further comprising separating said post bond split layer from said cleaved layer.

9. A method for bonding at least two substrates together comprising:
    placing the substrates into a first chamber;
    exposing at least one surface of a first of said at least two substrates to an ion beam to reduce the surface species of the at least one surface in preparation for bonding to a second of said at least two substrates;
    aligning the first and second substrates at a desired temperature within said first chamber;
    moving said first and second substrates from said first chamber to a second chamber, said first and second chamber maintaining a vacuum environment therebetween;
    placing the exposed surface of said first substrate together and in contact with a surface of said second substrate within said second chamber to form bonded substrates.

10. The method of claim 9 further comprising tilting the first substrate at an angle with respect to said ion beam when the first substrate is exposed to said ion beam.

11. The method of claim 9 further comprising raising the temperature of said second chamber to initiate a post bond split layer of said bonded substrates.

12. The method of claim 11 further comprising creating a cleaved layer from said bonded substrates.

13. The method of claim 12 further comprising separating said post bond split layer from said cleaved layer.

14. An ion implanter processing system comprising:
    an ion source chamber configured to receive a feed gas and generate ions having a particular energy and mass, said ion source chamber having an aperture through which said ions are extracted;
    a target chamber positioned downstream of said ion source configured to receive said ion beam;

a first chuck assembly positioned within said target chamber, said first chuck assembly configured to receive a first substrate aligned with said ion beam;

a second chuck assembly positioned within said target chamber, said second chuck assembly configured to receive a second substrate;

said ion beam having a particular implant energy such that ions activate a surface layer of said first substrate; and a second chamber connected to said target chamber, said target chamber and said second chamber maintaining a vacuum environment therebetween, and wherein said first chuck assembly and said second chuck assembly are configured to move between said target chamber and said second chamber and are further configured-to position said first and second substrates in contact with one another within said second chamber.

* * * * *